(12) United States Patent
Voigtlaender et al.

(10) Patent No.: US 6,717,261 B2
(45) Date of Patent: Apr. 6, 2004

(54) INTEGRATED SEMICONDUCTOR CIRCUIT

(75) Inventors: Klaus Voigtlaender, Wangen (DE); Michael Thiel, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/192,930

(22) Filed: Jul. 10, 2002

(65) Prior Publication Data

US 2003/0034556 A1 Feb. 20, 2003

(30) Foreign Application Priority Data

Jul. 10, 2001 (DE) .......................... 101 32 763

(51) Int. Cl.[7] ............................................. H01L 23/34
(52) U.S. Cl. ...................... 257/728; 257/275; 257/625; 257/659; 257/713
(58) Field of Search ................ 257/728, 713, 257/199, 259, 275–277, 482, 523, 604, 624–625, 659, 662, 664

(56) References Cited

U.S. PATENT DOCUMENTS

| 5,006,505 A | * | 4/1991 | Skertic ........................ 505/163 |
| 5,079,618 A | * | 1/1992 | Farnworth ................... 257/713 |
| 5,166,777 A | * | 11/1992 | Kataoka ....................... 257/716 |
| 5,449,952 A | * | 9/1995 | Kataoka et al. ............. 257/716 |
| 5,714,791 A | * | 2/1998 | Chi et al. .................... 257/467 |
| 6,476,483 B1 | * | 11/2002 | Adler et al. ................. 257/713 |
| 6,476,508 B1 | * | 11/2002 | Strnad ......................... 257/930 |
| 2002/0092307 A1 | * | 7/2002 | Ghoshal ....................... 62/3.7 |

FOREIGN PATENT DOCUMENTS

| JP | 406013509 A | * | 1/1994 |
| JP | 408136422 A | * | 5/1996 |

\* cited by examiner

*Primary Examiner*—David Nelms
*Assistant Examiner*—Andy Huynh
(74) *Attorney, Agent, or Firm*—Kenyon & Kenyon

(57) ABSTRACT

An integrated semiconductor circuit including a substrate and at least one microwave circuit area supported by a substrate is provided, at least one cooling area supported by the substrate being provided for cooling the microwave circuit area, the at least one cooling area having electric contacts and regions having different types of doping so that cooling may be accomplished by the Peltier effect.

19 Claims, 6 Drawing Sheets

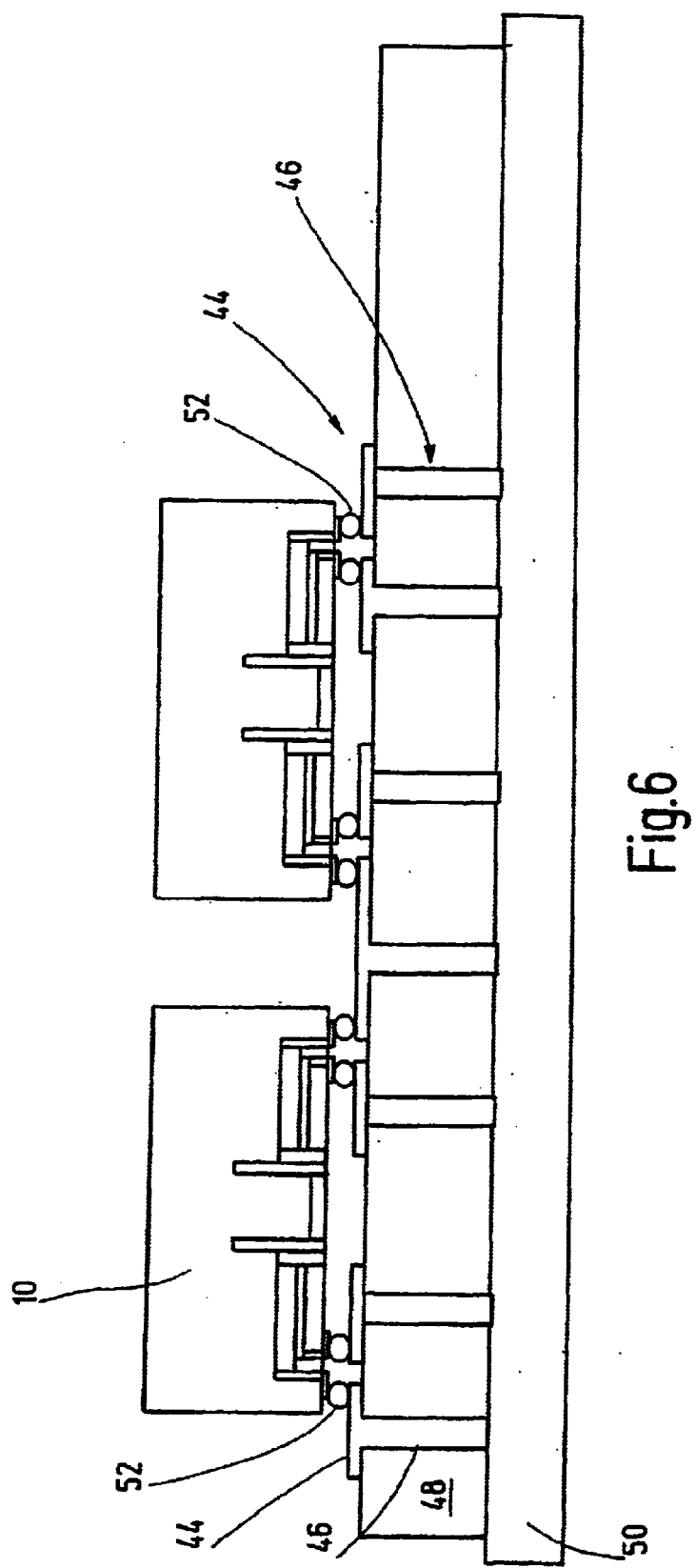

US 6,717,261 B2

INTEGRATED SEMICONDUCTOR CIRCUIT

FIELD OF THE INVENTION

The present invention relates to an integrated semiconductor circuit having a substrate and at least one microwave circuit area supported by the substrate. The present invention also relates to a method of cooling a microwave circuit area of an integrated semiconductor circuit supported by a substrate. Furthermore, the present invention relates to a method of producing an integrated semiconductor circuit.

BACKGROUND INFORMATION

The field of application of semiconductor circuits encompasses the production of microwaves in addition to numerous other applications. Microwaves generated by semiconductor circuits are used, for example, in conjunction with automotive applications such as adaptive cruise control (ACC) and short-range radar (SRR). In these applications as well as many others, an attempt is made to generate microwaves having the highest possible frequencies. Higher frequencies are provided in particular by combining discrete semiconductors in microwave circuits to give MMICs ("microwave monolithic integrated circuits"). Transit frequencies of 150 GHz are currently being achieved with GaAs systems and 50 GHz with SiGe systems, and with Si systems it is possible to make available transit frequencies of 5 GHz.

However, one problem is that the transit frequencies and thus also the achievable operating frequencies deteriorate in quality at higher temperatures. It is therefore desirable to keep the microwave circuit areas at a low temperature, which may be achieved by cooling, for example.

SUMMARY OF THE INVENTION

According to an embodiment of present invention, an integrated semiconductor circuit is provided that supports at least one cooling area by a substrate for cooling a microwave circuit area, the at least one cooling area having electric contacts and regions having different types of doping so that cooling may be accomplished by the Peltier effect. This embodiment provides an RF-compatible and inexpensive option for cooling microwave circuits. In comparison with external Peltier elements on which integrated circuits may be placed, the integrated semiconductor circuit according to an embodiment of the present invention yields an advantage because the former implementations can suffer from irregular transitions. In addition, the implementation according to the embodiment of the present invention provides extremely compact cooling.

According to a further embodiment of the integrated semiconductor circuit according to the present invention, the substrate includes doping of a first type, the at least one cooling area has a first region including the doping of the first type, an insulation layer above the first region and a second region including a second type of doping above the insulation layer. It is possible in this way to arrange electric contacts on the doped regions so that a Peltier effect is achieved for cooling the microwave circuit area.

According to a further embodiment, the first region includes a first electric contact for supplying a first electric potential, the second region has a second electric contact for supplying a second electric potential, and the first and second regions are connected to a third electric contact. According to this embodiment, a voltage may be supplied to electric contacts of the doped regions so that a cooling effect occurs at the third electric contact between the doped regions, while heat is dissipated in the direction of the power supply contacts.

According to a particular embodiment, the microwave circuit area is electrically insulated from the at least one cooling area. This ensures that the microwave circuit function of the extra-high-frequency component is not influenced electrically by the at least one cooling area. Likewise, the electric insulation may be arranged so that sufficient heat transfer is available. The insulation may be implemented in the form of deep trenches, for example.

In addition, according to one implementation, the third electric contact may be arranged closer to the microwave circuit area than the first and second electric contacts. Due to this geometric arrangement, the cooling effect at the third electric contact can dissipate heat from the microwave circuit area particularly effectively.

In addition, according to a further implementation, it is advantageous that the first type of doping is a p-type, the second type of doping is an n-type, and the insulation layer is an oxide layer. In this way, the semiconductor circuit according to the present invention may include a p-doped substrate.

However, according to another implementation, it may also be beneficial for the first type of doping to be an n-type, the second type of doping to be a p-type and the insulation layer to be an oxide layer. Thus, the present invention may also be implemented using an n-doped substrate, in which case the polarities of the voltage supplied may be adjusted accordingly.

According to a further embodiment, the integrated semiconductor circuit according to the present invention is arranged so that thermal energy may be radiated in the area of the first and second electric contacts. Since the first and second electric contacts may be situated at a sufficient distance from the microwave circuit area, radiation of heat from this area is possible without any harmful effect on the microwave circuit area. For numerous applications, the heat transfer through radiation is sufficient.

Tt may also be beneficial for the first and/or second electric contacts to be connected to means for dissipating thermal energy. This may be accomplished, for example, by applying MMICs to metallic contact plates by using a flip-chip arrangement. The heat is then dissipated from these plates through thermal vias to cooling bodies having a high thermal capacity.

According to another embodiment of the integrated semiconductor circuit according to the present invention, multiple cooling areas are included in one microwave circuit area. A plurality of pn-junctions are provided in this manner to implement Peltier cooling.

The present invention provides a method for cooling a microwave circuit by providing at least one cooling area supported by a substrate for cooling the microwave circuit area, the at least one cooling area having electric contacts and regions having different types of doping, so that the microwave circuit area is cooled by the Peltier effect.

According to another embodiment, the method according to the present invention includes doping the substrate with a first type of doping, doping a first region of the at least one cooling area with the first type of doping, doping an insulation layer above the first region with the first type of doping and doping a second region above the insulation layer with a second type of doping. The method may further include situating electric contacts in the doped regions in such a manner that cooling of the microwave circuit area is achieved by Peltier cooling of one of the electric contacts.

According to a further embodiment, an electrical potential is supplied via a first electric contact included in the first region, a second electric potential is supplied via a second electric contact included in the second region, the first and second regions are connected to a third electric contact, and the electric potentials are selected as a function of the doping in such a way that the third electric contact is cooled. A voltage which produces cooling of an area situated in proximity to the microwave circuit area may thus be applied to the at least one cooling area, depending on the types of doping of the respective regions. Conversely, an area situated at a distance from the microwave circuit area may be heated.

According to one implementation of the method according to the present invention, the first type of doping is a p-type, the second type of doping is an n-type and the electric potential at the first electric contact is selected to be lower than that at the second electric contact. Cooling of the third electric contact is implemented in this manner according to the present invention.

According to an alternative implementation, it may also be beneficial for the first type of doping to be an n-type, the second type of doping to be a p-type and the electric potential at the first electric contact to be selected to be greater than that at the second electric contact. Peltier cooling of the microwave circuit area may thus also be adapted for an n-doped substrate having a suitably doped additional area.

In addition, it is advantageous that thermal energy is radiated in the area of the first and second electric contacts. Such radiation of thermal energy may take place without any additional measures and may be adequate, depending on the specific arrangement of circuit paths, the respective environment, and the quantity of heat to be dissipated.

Additionally, the first and/or second electric contacts may be connected to means for dissipating thermal energy. The radiation of thermal energy in the area of the first and second electric contacts may thus be accompanied by a dissipation of heat.

Multiple cooling areas may be used for one microwave circuit area. In this way, larger quantities of heat may be dissipated, because a larger number of pn-junctions are provided for implementation of Peltier cooling.

The present invention also provides to a method of producing an integrated semiconductor circuit, in particular for producing an integrated semiconductor circuit according to the present invention having a substrate, at least one microwave circuit area supported by the substrate and at least one cooling area supported by the substrate, the at least one microwave circuit area being formed in first steps, and the at least one cooling area being formed in second steps. This ensures that the wiring arrangement complies with RF requirements. First, the connecting lines relevant for the microwave function are constructed. Then a suitable number of integrated Peltier elements are added. They may then be connected optionally in series and/or in parallel.

The present invention provides the advantage that it is possible to cool monolithic integrated microwave circuits by cooling arrangements integrated into the same substrate that promote cooling based on the Peltier effect using doped regions.

BRIEF DESCRIPTION OF THE DRAWINGS

FIG. 6 shows a sectional view through a flip-chip structure having integrated semiconductor circuits according to an embodiment of the present invention.

DETAILED DESCRIPTION

Figure 1:
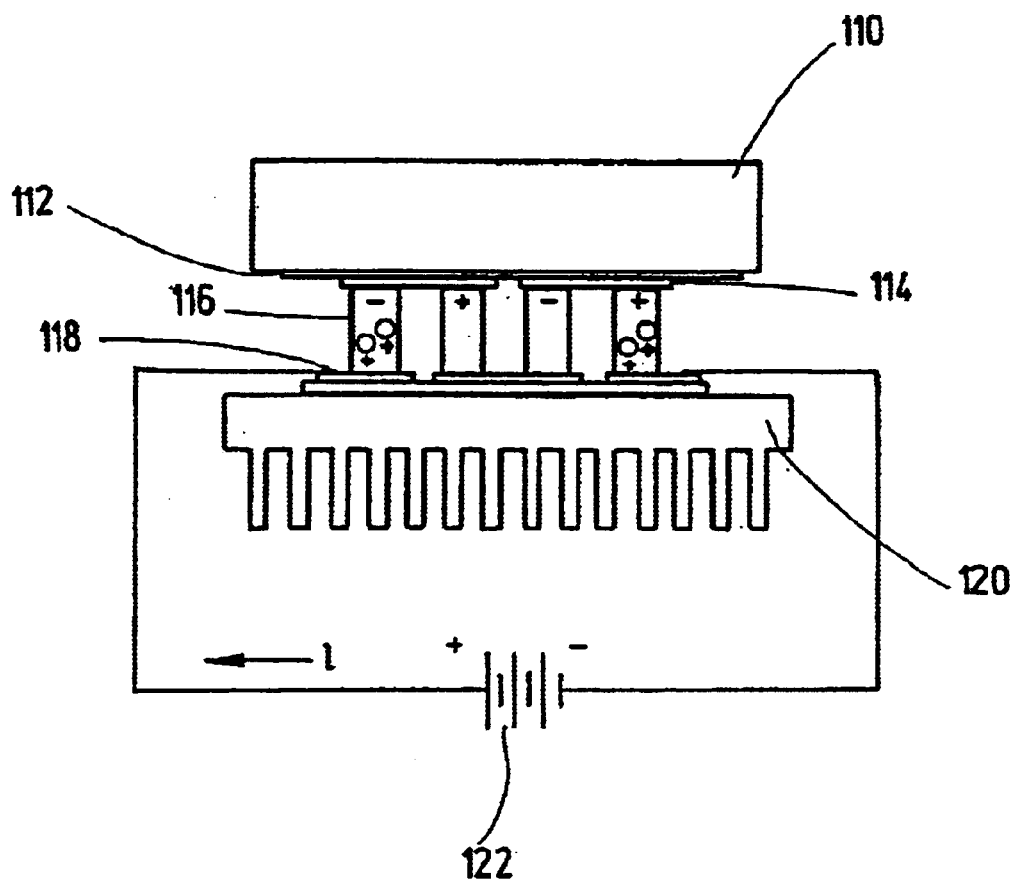
FIG. 1 shows a schematic diagram of a conventional arrangement for cooling an object using the Peltier effect.

FIG. 1 shows a schematic diagram of a conventional arrangement for cooling an object using the Peltier effect. Such an arrangement is used, for example, for dissipating the heating output of high-cycle computers. An object 110 to be cooled is connected to Te pellets 116 by a substrate 112 and conductor surfaces 114. These pellets 116 are connected to a heat sink 120 by additional conductor surfaces 118. Te pellets 116 are connected electrically in series via electric contacts 114, 118. A current flow is established by supplying a direct voltage to electric contacts 118 through direct voltage source 122. Because of the current overspill between Te pellets 116 and electric contacts 114 or 118, which are made of a different metal, cooling may occur in the area of object 110, given a suitable polarity.

Figure 2:
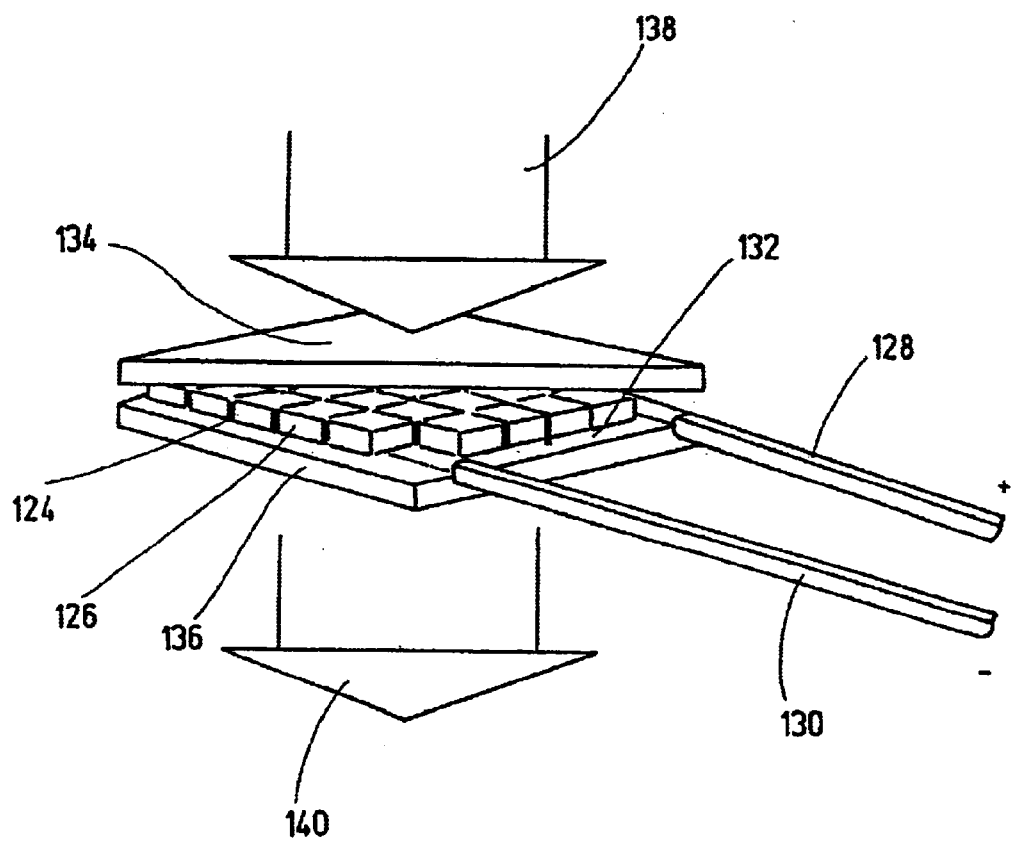
FIG. 2 shows a schematic diagram of a conventional semiconductor arrangement for providing a cooling body.

FIG. 2 shows a schematic diagram of a conventional semiconductor arrangement for providing a cooling body. In this arrangement, the Peltier effect is implemented by using semiconductor pellets 124, 126 having different types of doping. By applying a suitably polarized voltage over lines 128, 130, a current flow may be induced through the arrangement of semiconductor pellets 124, 126 by way of electric conductor 132. In this way, top ceramic substrate 134 is able to absorb heat 138, while bottom ceramic substrate 136 emits heat 140.

Figure 3:
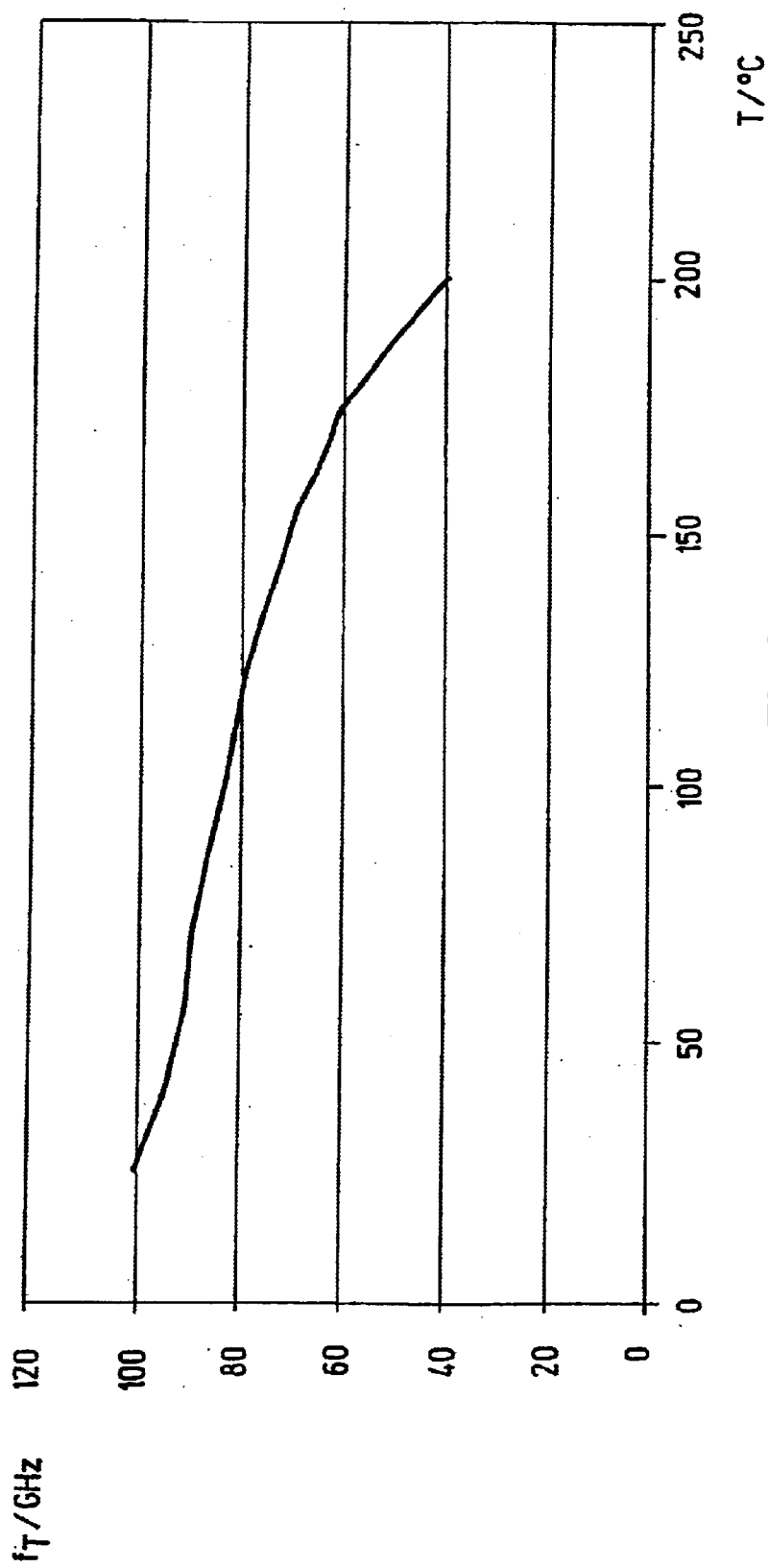
FIG. 3 shows a graph in which the transit frequency of an integrated microwave circuit is plotted as a function of temperature.

FIG. 3 shows a graph in which the transit frequency of an integrated microwave circuit is plotted as a function of temperature. It is apparent here that transit frequency $f_t$ between the temperature range of approx. 20° C. to 200° C. decreases from 100 GHz to 40 GHz, i.e., it drops by approx. 60%. To be able to operate at the highest possible frequency, it is therefore necessary to operate at the lowest possible temperatures. It is thus advisable to cool microwave circuit areas.

Figure 4:
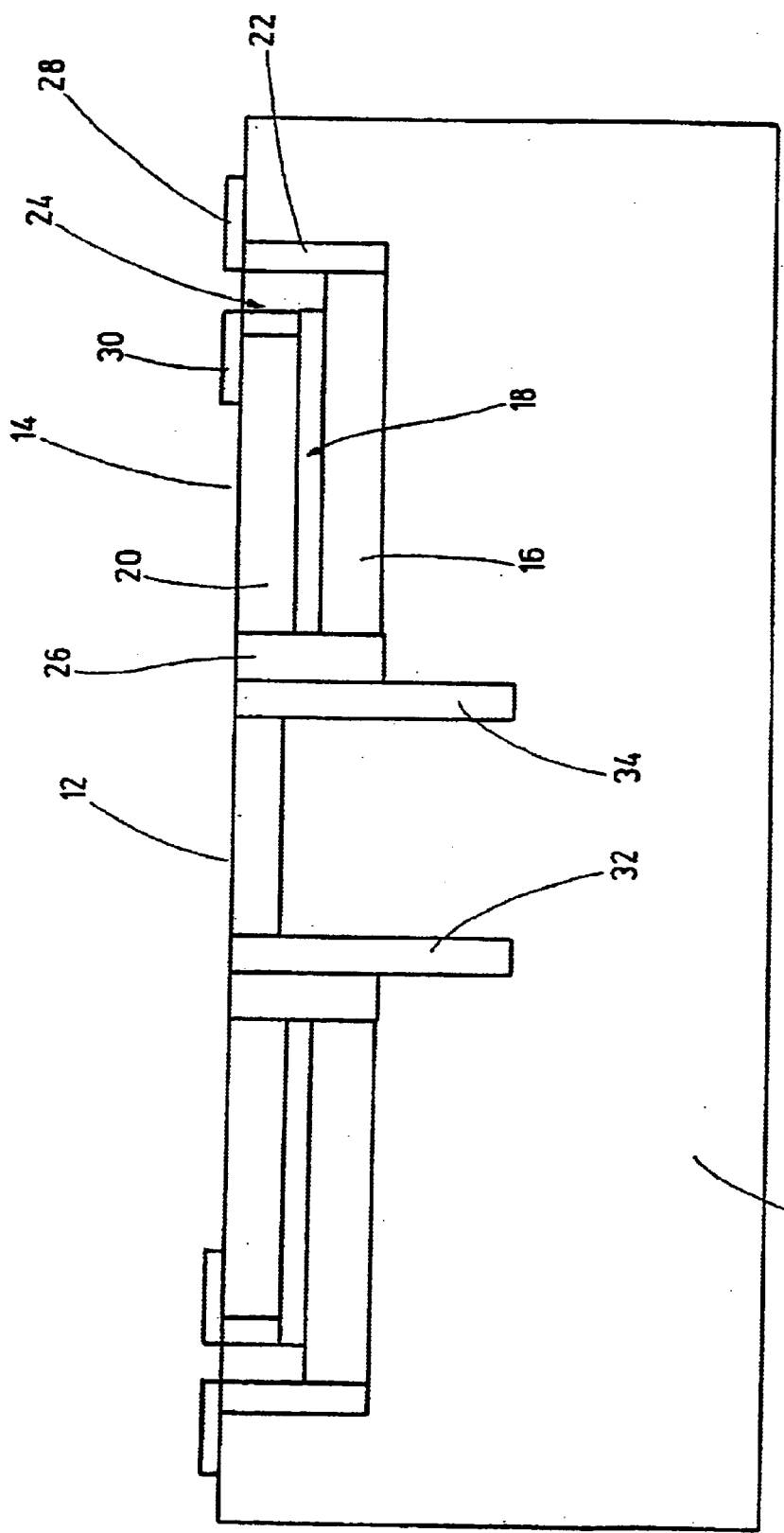
FIG. 4 shows a side view through a monolithic integrated microwave circuit having integrated cooling according to an embodiment of the present invention.

FIG. 4 shows a sectional view through a monolithic integrated microwave circuit having integrated cooling according to an embodiment of the present invention. While the present invention is explained with respect to a positively doped substrate 10, this is for illustrative purposes as corresponding effects are achievable by reversing the doping sign and polarity. A microwave circuit area 12, which is not described further here, is situated in positively doped substrate 10. This microwave circuit area 12 is electrically insulated from its environment by deep trenches 32, 34, heat transfer to the environment is however possible. In the present sectional view, cooling areas 14 are situated on both sides of microwave circuit area 12, the description of right-hand cooling area 14 being applicable to the left-hand cooling area as well. The left-hand cooling area which is visible in the sectional view, as well as additional cooling areas in the vicinity of microwave circuit area 12 are constructed in the same or a similar way. Cooling area 14 has a bottom layer p-doped region 16. This p-doped region 16 is partially covered by an insulation layer 18 which may be designed as an oxide layer. Oxide layer 18 is in turn covered partially by an n-doped region 20 above it. Doped layers 16, 20 are provided with electric contacts 22, 24, 26 implemented in the form of through-contacts. Bottom layer 16 is contacted to an electric contact 22 having a terminal face 28 on the top side of substrate 10. Top n-doped layer 20 is provided with a contact 24 connected to a terminal face 30 at the surface of substrate 10. The two doped layers 16, 20 are also connected to one another by an electric contact 26, which is directly adjacent to microwave circuit area 12 or deep trench 34. If a voltage of a suitable polarity is supplied to contacts 22, 24 or corresponding terminal faces 28, 30, a Peltier cooling effect may occur. In concrete terms, a negative potential is applied to contact 22 or terminal face 28, while a positive potential is applied to electric terminal 24 or terminal face 30. This yields a Peltier element which creates cooling in the case of electric contact 26 and dissipates heat in the direction of contacts 22, 24 or terminal faces 28, 30. Microwave circuit area 12 may thus be cooled effectively.

Figure 5:
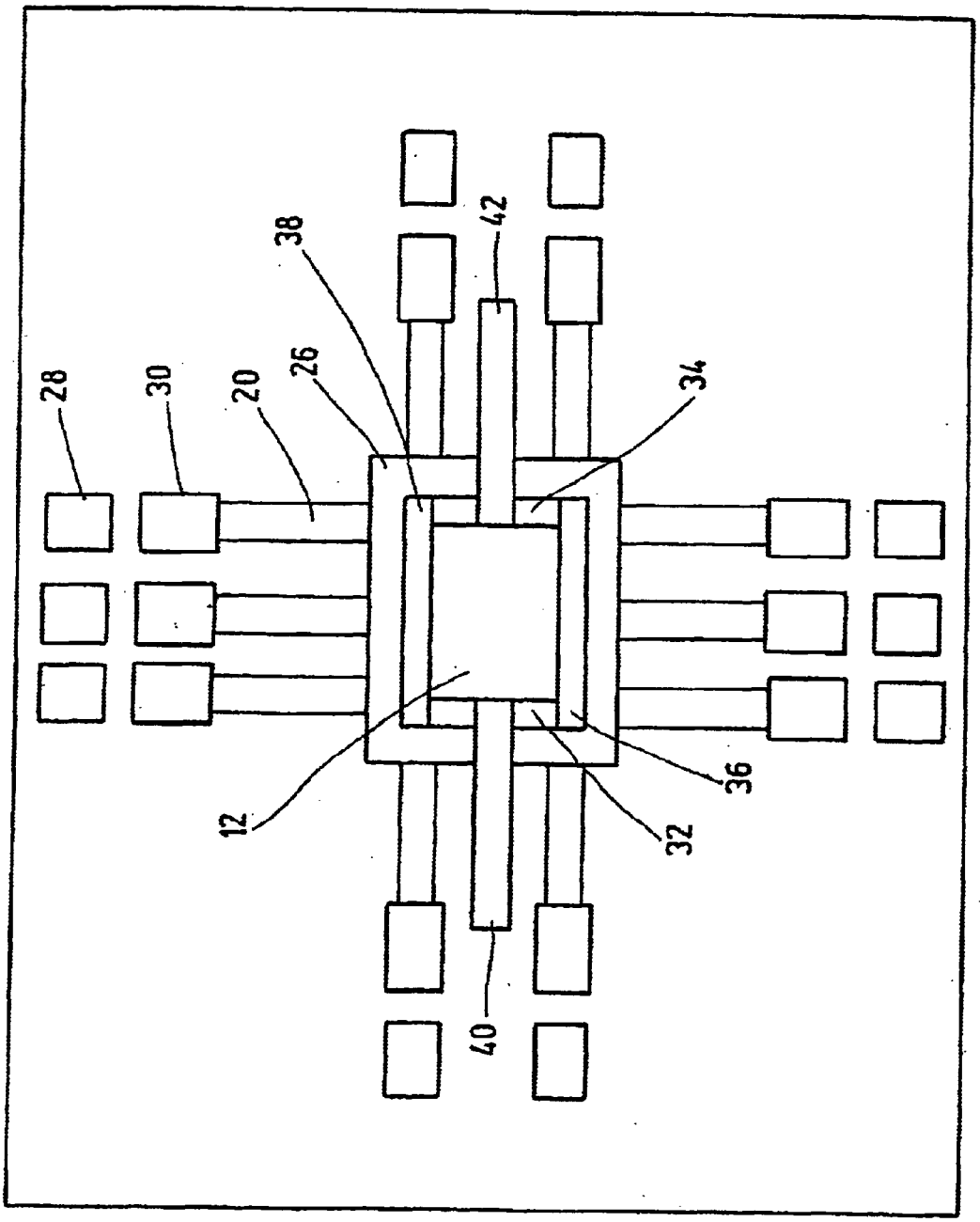
FIG. 5 shows a top view of a monolithic integrated microwave circuit having integrated cooling according to an embodiment of the present invention.

FIG. 5 shows a top view of a monolithic integrated microwave circuit having integrated cooling according to an embodiment of the present invention. In addition to the components explained above in conjunction with FIG. 4, electric connections 40, 42 to microwave circuit area 12 are also shown. In addition, FIG. 5 shows a plurality of cooling areas arranged around microwave circuit area 12. These cooling areas may all be designed in the manner described in conjunction with FIG. 4. The cooling areas shown at the top or bottom in the top view are also electrically insulated from the environment by deep trenches 36, 38. Effective cooling of microwave circuit area 12 may be implemented by providing a plurality of cooling elements. The cooling elements may be connected in series and/or in parallel.

According to an embodiment of a method of producing an integrated semiconductor circuit such as illustrated in FIGS. 4 and 5, the electric connecting paths relevant for the function of the microwave circuit area are constructed first. This ensures optimum function. Then the cooling areas are inserted.

FIG. 6 shows a sectional view through a flip-chip arrangement having integrated semiconductor circuits according to an embodiment of the present invention. This shows measures by which heat may be dissipated in a targeted manner in the direction of a heat sink in addition to simple radiation of heat. FIG. 6 shows two substrates 10, with the additional dissipation of heat illustrated with respect to the substrate 10 on the left. Monolithic integrated microwave circuits are applied to metallic contact plates 44 by using a flip-chip arrangement and soldered joints 52. These metallic contact plates 44 are arranged on a carrier 48 which is implemented in the form of circuit board, soft board, LTCC ("low temperature cofired ceramics") or some other type of ceramic. Carrier 48 sits on a metal body 50 which functions as a heat sink. Thermal vias 46 are provided between printed circuit boards 44 and metal body 50, ultimately dissipating heat away from the monolithic integrated microwave circuits.

The preceding description of exemplary embodiments according to the present invention is presented only for illustrative purposes and not for the purpose of restricting the present invention. Various changes and modifications to the embodiments herein are understood to be within the scope of the present invention.

What is claimed is:

1. An integrated semiconductor circuit comprising:
   a substrate;
   at least one microwave circuit area supported by the substrate; and
   at least one cooling area supported by the substrate for cooling the at least one microwave circuit area, the at least one cooling area including electric contacts and regions having different types of doping to provide cooling via Peltier effect;
   wherein the substrate includes a first type of doping, and the at least one cooling area includes:
   a first region having the first type of doping;
   an insulation layer positioned above the first region; and
   a second region having a second type of doping positioned above the insulation layer.

2. The integrated semiconductor circuit of claim 1, wherein the first region includes a first electric contact for supplying a first electric potential, and the second region includes a second electric contact for supplying a second electric potential, the first region and the second region being connected to a third electric contact.

3. The integrated semiconductor circuit of claim 2, wherein the third electric contact is situated closer to the at least one microwave circuit area than the first electric contact and the second electric contact.

4. The integrated semiconductor circuit of claim 2, further comprising:
   a radiating area including the first electric contact and the second electric contact, the radiating area radiating thermal energy.

5. The integrated semiconductor circuit of claim 2, further comprising:
   an arrangement for dissipating thermal energy connected to at least one of the first electric contact and the second electric contact.

6. The integrated semiconductor circuit of claim 2, wherein the first type of doping is a p-type, the second type of doping is an n-type, and the insulation layer is an oxide layer.

7. The integrated semiconductor circuit of claim 2, wherein the first type of doping is an n-type, the second type of doping is a p-type, and the insulation layer is an oxide layer.

8. The integrated semiconductor circuit of claim 3, wherein the first type of doping is a p-type, the second type of doping is an n-type, and the insulation layer is an oxide layer.

9. The integrated semiconductor circuit of claim 3, wherein the first type of doping is an n-type, the second type of doping is a p-type, and the insulation layer is an oxide layer.

10. The integrated semiconductor circuit of claim 3, further comprising:
    a radiating area including the first electric contact and the second electric contact, the radiating area radiating thermal energy.

11. The integrated semiconductor circuit of claim 3, further comprising:
    an arrangement for dissipating thermal energy connected to at least one of the first electric contact and the second electric contact.

12. The integrated semiconductor circuit of claim 1, wherein the at least one microwave circuit area is electrically insulated from the at least one cooling area.

13. The integrated semiconductor circuit of claim 1, wherein the first type of doping is a p-type, the second type of doping is an n-type, and the insulation layer is an oxide layer.

14. The integrated semiconductor circuit of claim 13, further comprising:
a radiating area including the first electric contact and the second electric contact, the radiating area radiating thermal energy.

15. The integrated semiconductor circuit of claim 13, further comprising:
an arrangement for dissipating thermal energy connected to at least one of the first electric contact and the second electric contact.

16. The integrated semiconductor circuit of claim 1, wherein the first type of doping is an n-type, the second type of doping is a p-type, and the insulation layer is an oxide layer.

17. The integrated semiconductor circuit of claim 16, further comprising:
a radiating area including the first electric contact and the second electric contact, the radiating area radiating thermal energy.

18. The integrated semiconductor circuit of claim 16, further comprising:
an arrangement for dissipating thermal energy connected to at least one of the first electric contact and the second electric contact.

19. The integrated semiconductor circuit of claim 1, wherein multiple cooling areas are allocated for the at least one microwave circuit area.

* * * * *